United States Patent
Chu et al.

(10) Patent No.: US 7,106,629 B2
(45) Date of Patent: Sep. 12, 2006

(54) SPLIT-GATE P-CHANNEL FLASH MEMORY CELL WITH PROGRAMMING BY BAND-TO-BAND HOT ELECTRON METHOD

(75) Inventors: Wen-Ting Chu, Kaohsiung County (TW); Chia-Ta Hsieh, Tainan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 187 days.

(21) Appl. No.: 10/788,949

(22) Filed: Feb. 27, 2004

(65) Prior Publication Data

US 2005/0190595 A1    Sep. 1, 2005

(51) Int. Cl.
*G11C 11/34* (2006.01)

(52) U.S. Cl. .............. 365/185.1; 365/185.05; 365/185.28; 365/185.29

(58) Field of Classification Search ........... 365/185.1, 365/185.05, 185.28, 185.29
See application file for complete search history.

(56) References Cited

U.S. PATENT DOCUMENTS

| | | | | |
|---|---|---|---|---|
| 5,130,769 A | * | 7/1992 | Kuo et al. | 357/23.5 |
| 5,706,227 A | * | 1/1998 | Chang et al. | 365/185.18 |
| 6,363,012 B1 | * | 3/2002 | Lin et al. | 365/185.18 |
| 6,822,285 B1 | * | 11/2004 | Lojek | 257/314 |
| 2004/0125653 A1 | * | 7/2004 | Tran et al. | 365/185.22 |

* cited by examiner

*Primary Examiner*—Son T. Dinh
*Assistant Examiner*—N. Nguyen
(74) *Attorney, Agent, or Firm*—Tung & Associates

(57) ABSTRACT

A split-gate, P-channel flash memory cell having a band-to-band hot electron (BBHE) programming method is defined to improve the endurance characteristics of performance of the cell. The split-gate, P-channel structure, which includes a P+ drain, P+ source, floating gate and a control gate, advantageously improves protection from over-erase and hot-hole trap conditions, and improves programming speed and higher injection efficiency. The cell is erased by a polysilicon-polysilicon tunneling technique.

20 Claims, 3 Drawing Sheets

310

| TABLE T1 - DUAL HIGH VOLTAGE | | | | | |
|---|---|---|---|---|---|
| | CONTROL GATE | DRAIN | SOURCE | N-WELL | PULSE WIDTH |
| PROGRAM | 7.5V | -11V (UNSELECT = 0V) | 0V | 0V | 10 MICROSECS. |
| ERASE | 13V | 0V | 0V | 0V | 10 MILLISECS. |
| READ | 0V | 1V | 2.5V | 2.5V | --- |

312 → PROGRAM
314 → ERASE
316 → READ

320

| TABLE T1 - DUAL HIGH VOLTAGE | | | | | |
|---|---|---|---|---|---|
| | CONTROL GATE | DRAIN | SOURCE | N-WELL | PULSE WIDTH |
| PROGRAM | 12.5V | 0V (UNSELECT = 3V) | FLOATING | 12.5V | 10 MICROSECS. |
| ERASE | 13V | 0V | 0V | 0V | 10 MILLISECS. |
| READ | 0V | 1V | 2.5V | 2.5V | --- |

322 → PROGRAM
324 → ERASE
326 → READ

SPLIT-GATE P-CHANNEL FLASH MEMORY CELL WITH PROGRAMMING BY BAND-TO-BAND HOT ELECTRON METHOD

BACKGROUND

The present invention relates generally to nonvolatile memories and particularly to electrically erasable nonvolatile memories.

Semiconductor memory devices may be characterized to be volatile or nonvolatile, depending on whether a memory device is able to retain the contents of the memory on removal of power to the device. Typical well-known examples of volatile memory devices include random access memories RAM's such as SRAM's and DRAM's, and examples of nonvolatile memory (NVM) devices include read only memories (ROM's). There are many types of ROM devices including erasable programmable read only memories (EPROMs), electrically erasable and programmable read only memories (EEPROMs) and flash EEPROM memories. Typically EPROMs are erasable through light exposure and are electrically programmable. Conventional EEPROMs have the same programming functionality, however instead of being light erasable they may be erased and programmed by an electron tunneling process facilitated by an on-chip electrical signal. Thus, information may be stored in these NVM devices, retained when the power is off, and the devices may be erased for reprogramming, as necessary, using appropriate techniques. A memory cell in a flash memory device may be individually programmed. Several memory cells may be advantageously erased as a block, typically resulting in improved performance compared to conventional EEPROMs.

Presently, flash memories have gained considerable popularity due to their smaller size, lower power consumption and improved read/write performance. For example, flash memories are often utilized to provide on-chip memory for portable devices such as cellular phones, digital cameras, audio/video recorders, modems, SMART cards and the like where it is desirable to store information that may need fast updating.

The typical data storage element of an EEPROM memory cell is a floating gate transistor, which is a field-effect transistor (FET) having an electrically isolated (floating) gate that controls electrical conduction between source and drain regions of the cell. Data is represented by a charge stored on the floating gate and the resulting conductivity obtained between source and drain regions. A floating gate memory cell may be formed in a P-type substrate with an N-type diffused source region and an N-type drain diffusion formed in the region. A floating gate, typically made of doped polysilicon, is located over the channel region and is electrically isolated from the other cell elements by oxide. For example, a thin gate oxide may be located between the floating gate and the channel region. A control gate is typically located over the floating gate and may also be made of doped polysilicon. The control gate is typically separated from the floating gate by a dielectric layer.

Basic operations of the EEPROM memory cell may be described as: a) programming, b) erasing, and c) reading. Programming usually refers to transferring a charge to the floating gate. Erasing usually refers to removing the charge from the floating gate and reading involves sensing an electrical signal of the cell to determine if the device is in a programmed or an erased state.

Functionality and fabrication method of a flash memory device such as a conventional N-channel, stack-gate memory cell is well known. However, some of these traditional techniques often result in well-known problems such as creating over-erase and hot-hole trap conditions often resulting in low programming speed and low injection efficiency. This leads to the degradation of the endurance performance of the memory cell.

Thus, a need exists to provide an improved memory cell that offers: a) protection from over-erase and hot-hole trap conditions, and b) an improved programming speed and higher injection efficiency. Additionally, it would be desirable for the improved memory cell to offer a higher endurance performance when compared to the traditional memory cell.

SUMMARY OF THE INVENTION

The problems outlined above are addressed in a large part by an apparatus and method for improving endurance characteristics of a flash memory cell, as described herein. According to one form of the invention, a split-gate, P-channel flash memory cell having a band-to-band hot electron (BBHE) programming method is defined to improve the endurance characteristics of performance of the cell. The split-gate, P-channel structure, which includes a P+ drain, P+ source, floating gate and a control gate, advantageously improves protection from over-erase and hot-hole trap conditions, and improves programming speed and higher injection efficiency. The cell is erased by a polysilicon-polysilicon tunneling technique.

According to another aspect of the invention, the method for improving endurance characteristics of a flash memory cell includes defining the flash memory cell to include a split-gate, P-channel structure. The flash memory cell is erased by deploying a polysilicon-polysilicon tunneling technique and programmed by deploying a band-to-band hot electron technique.

Other forms, as well as objects and advantages of the invention will become apparent upon reading the following detailed description and upon reference to the accompanying drawings.

BRIEF DESCRIPTION OF THE DRAWINGS

Novel features believed characteristic of the invention are set forth in the appended claims. The invention itself, however, as well as a preferred mode of use, various objectives and advantages thereof, will best be understood by reference to the following detailed description of an illustrative embodiment when read in conjunction with the accompanying drawings.

DETAILED DESCRIPTION OF AN EMBODIMENT

Figure 1:
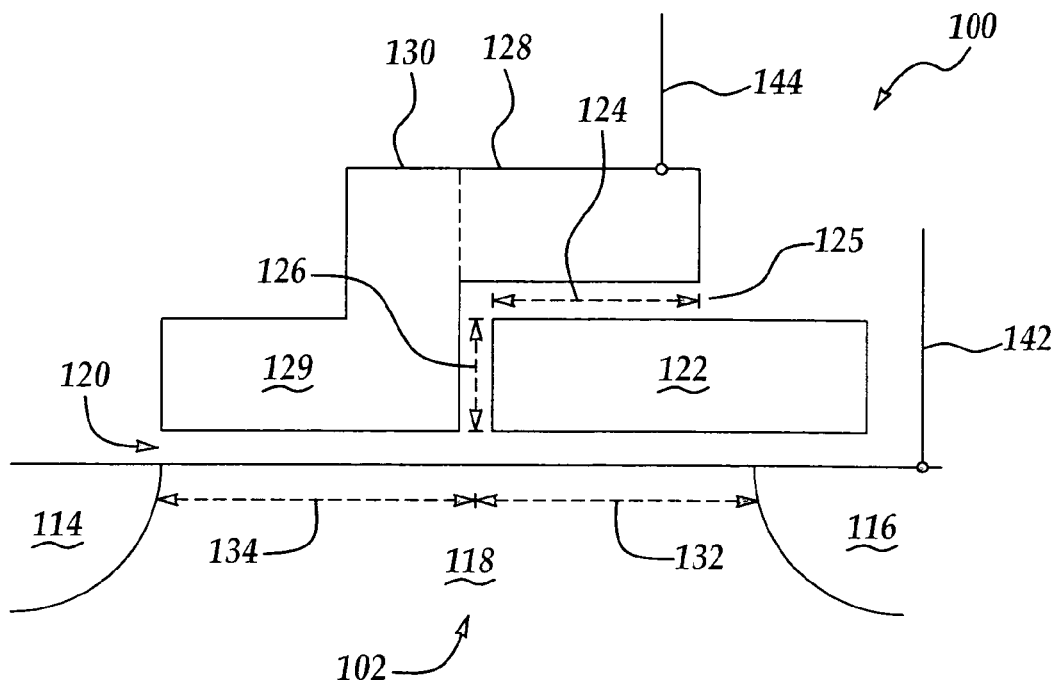
FIG. 1 is an illustrative cross-sectional diagram of a split-gate, P-channel flash memory cell, according to an embodiment.

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Elements, which appear in more than one figure herein, are numbered alike in the various figures. The present invention describes an apparatus and method to improve endurance performance of a memory cell. According to one form of the invention, a split-gate, p-channel flash memory cell structure having band-to-band hot electron programming method is defined to improve the endurance performance. The improved flash memory cell advantageously offers: a) better protection from over-erase and hot-hole trap conditions, and b) an improved programming speed and higher injection efficiency.

As described herein, flash endurance is the number of program/erase cycles a flash device is operable to withstand without any failure. As flash devices undergo repeated number of program/erase cycles, over time, they are increasingly subject to device deterioration and fatigue and/or faulty programming that may render entire sections of the memory inoperable. Flash reliability is the absence of hard failures, which are typically unrecoverable faults in the device that are generally attributable to defects during the manufacturing process, as opposed to the endurance defects that occur as a result of continued operation of the devices until they physically degrade or are mis-programmed (e.g., over erased and/or under erased cells).

FIG. 1 is an illustrative cross-sectional diagram of a split-gate, P-channel flash memory cell 100, according to an embodiment. The cell 100 includes a semiconductor substrate 102, such as silicon. In the depicted embodiment, the substrate 102 is an N type silicon substrate, e.g., an N-well. Within the N-well semiconductor substrate 102 are defined a P+ source region 114, a P+ drain region 116 and with a channel region 118 there between. Disposed over the source region 114, the channel region 118, and the drain region 116, is a first layer 120 of insulating material. The first layer 20 may include an insulating material such as silicon dioxide, silicon nitride or silicon oxynitride. The P+ drain region 116 is coupled to a bit line 142 of the memory cell 100.

Disposed over the first layer 120 is a floating gate 122. The floating gate 122 is positioned over a first portion 132 of the channel region 118 and over a portion of the P+ drain region 116. In one embodiment, the floating gate 122 may be a polysilicon gate. A second insulating layer 125 has a first portion 124 disposed over the floating gate 122 and a second portion 126 disposed adjacent to the floating gate 122. The first portion 124 (e.g., the top wall 124) of the second layer 25 is an insulating material such as silicon dioxide, silicon nitride or silicon oxynitride. The second portion 126 (e.g., the side wall 26) of the second layer 25 is also of an insulating material such as silicon dioxide, silicon nitride or silicon oxynitride.

A control gate 129 has two portions: a first portion 128 is disposed over the top wall 124 of the second layer 125; a second portion 130 is disposed over the first layer 120 and is immediately adjacent to the side wall 126 of the second layer 125. In one embodiment, the second portion 130 of the control gate 129 extends over a second portion 134 of the channel region 118 positioned between the P+ source region 114 and the first portion 132. In one embodiment, the second portion 134 includes a portion of the P+ source region 114 and extends up to the first portion 132 of the channel region 118. The control gate 129 is coupled to a word line 144 of the memory cell 100.

In the depicted embodiment, the spilt-gate, P-channel structure of the cell 100 advantageously eliminates the well-known over-erase and hot-hole trap conditions associated with conventional stack-gate, N-channel flash memory cell.

As previously described, programming a flash memory cell is performed by injecting or transferring a sufficient charge (above a predefined threshold level) to the floating gate 122. In one embodiment, the spilt-gate, P-channel flash memory cell 100 is advantageously programmed by using a band-to-band hot electron (BBHE) technique. The BBHE technique provides higher injection efficiency when compared to conventional channel hot electron (CHE) injection and Fowler-Nordheim (FN) tunneling techniques for cell programming. The BBHE technique includes inducing band-to-band tunneling current from the semiconductor substrate 102 to one of the P+ source 114 and P+ drain 116 near the channel 118, and applying a positive bias voltage to the control gate 129 to induce hot electron injection into the floating gate 122. In one embodiment, the other one of the P+ source 114 and P+ drain 116 terminals is floated, e.g., is disconnected, so that current does not flow through that terminal.

In one embodiment, operation of the cell 100 (e.g., perform program, erase and read functions) may use dual high voltages. In this embodiment, the BBHE tunneling current may be induced by applying a reference potential of approximately 0 volts to the P+ source 114, a negative bias of approximately −11 volts to the P+ drain 116, and a positive voltage ranging from about +6 volts to about +10 volts to the control gate 129. In one embodiment, operation of the cell 100 may use a single high voltage. Additional details of operation conditions of a flash memory cell, including the cell 100, using single and dual high voltages are described in FIG. 3.

The BBHE technique for programming the cell 100 advantageously provides higher programming speed compared to traditional programming techniques by a factor of about 100. Due to the smaller voltage drop across the oxide required for this programming technique, the stress on the oxide is less compared to conventional techniques. The reliability problems arising due to stress on the oxide are also advantageously resolved. Moreover, the BBHE technique also advantageously enhances hot electron injection efficiency since this technique avoids hot hole injection.

As previously described, process for erasing a flash memory cell is reverse of the programming process. That is, erasing of a flash memory cell is performed by removing or transferring a sufficient charge (below a predefined threshold level) from the floating gate 122. In one embodiment, a polysilicon to polysilicon tunneling technique is used for erasing. In this technique, a positive voltage ranging from about +10 volts to about +15 volts is applied to the control gate 129, and a reference potential of approximately 0 volts is applied to the P+ source 114 and to the P+ drain 116, thereby causing removal of electrons from the floating gate 122.

Figure 2:
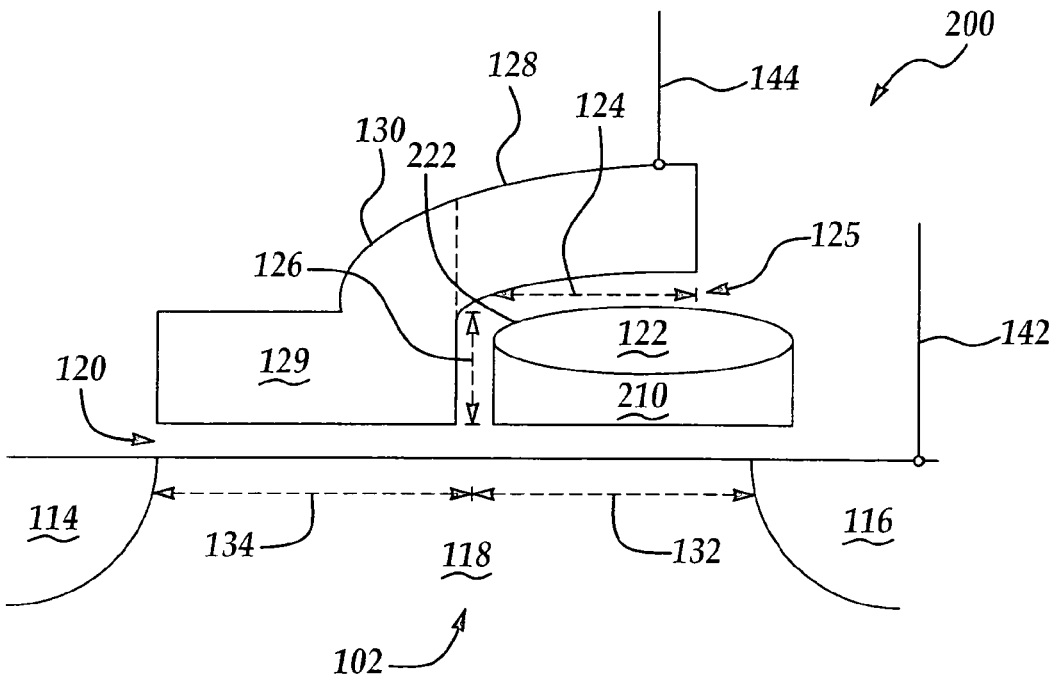
FIG. 2 is an illustrative cross-sectional diagram of a split-gate, P-channel flash memory cell 200 having a tip, according to an embodiment.

FIG. 2 is an illustrative cross-sectional diagram of a split-gate, P-channel flash memory cell 200 having a tip, according to an embodiment. The structure and operation of the memory cell 200 is substantially similar to the memory cell 100 except as noted below. For example, the shape and thickness of elements such as the floating gate 122, and the control gate 129 are different. An additional polysilicon layer 210 having a double concave surface is positioned between the floating gate 122 and the first layer 120. In the depicted embodiment, the thickness of the floating gate 122 and the thickness of the polysilicon layer 210 below the floating gate 122 is variable. In the depicted embodiment, the floating gate 122 has a matching double convex surface resulting in the formation of a tip 222. The tip 222 advantageously produces a stronger electric field compared to the memory cell 100 resulting in a faster and more efficient erasing of the cell 200.

Figures 3, 4A:
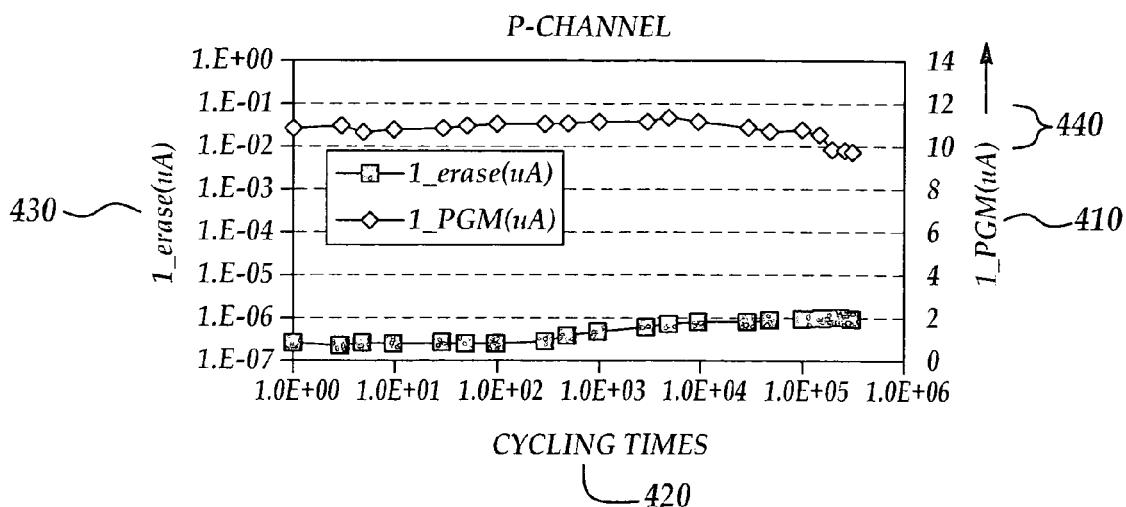
FIG. 3 illustrates, in a tabular form, exemplary voltage levels for operation of the memory cells 100 and 200 shown in FIG. 1 and FIG. 2, according to an embodiment.
FIG. 4A illustrates, in a graphical form, an endurance performance of the memory cells 100 or 200 shown in FIG. 1 and FIG. 2, according to an embodiment.

FIG. 3 illustrates, in a tabular form, exemplary voltage levels for operation of the memory cells 100 and 200 shown in FIG. 1 and FIG. 2, according to an embodiment. In one embodiment, the memory cells 100 and 200 use dual high voltages. In this embodiment, table T1 310 illustrates exemplary voltages levels applied to the control gate 129, the P+ drain 116, the P+ source 114, the N-well 102 for a program 312, erase 314 and read 316 operation. The table T1 310 also illustrates exemplary pulse widths for the program 312 and erase 314 operation.

In one embodiment, the memory cells 100 and 200 use a single high voltage. In this embodiment, a table T2 320 illustrates exemplary voltages levels applied to the control gate 129, the P+ drain 116, the P+ source 114, the N-well 102 for a program 322, erase 324 and read 326 operation. The table T2 320 also illustrates exemplary pulse widths for the program 322 and erase 324 operation.

FIG. 4A illustrates, in a graphical form, an endurance performance of the memory cells 100 or 200 shown in FIG. 1 and FIG. 2, according to an embodiment. In the depicted embodiment, shown is a combined plot of a program current 410 (on Y axis) versus cycling times 420 (on X axis) and erase current 430 (on Y axis) versus cycling times 420 (on X axis) for a memory cell 100 or 200 operating under a set of predefined voltage levels. The program current 410 and erase current 430 (shown on Y axis) are measured in micro-amperes ($\mu$A). As the cycling times 420 increases past several thousand program/erase cycles the program current 410 decreases by a factor delta 440 indicating some degradation in the endurance performance of the cell 100 or 200.

Figure 4B:
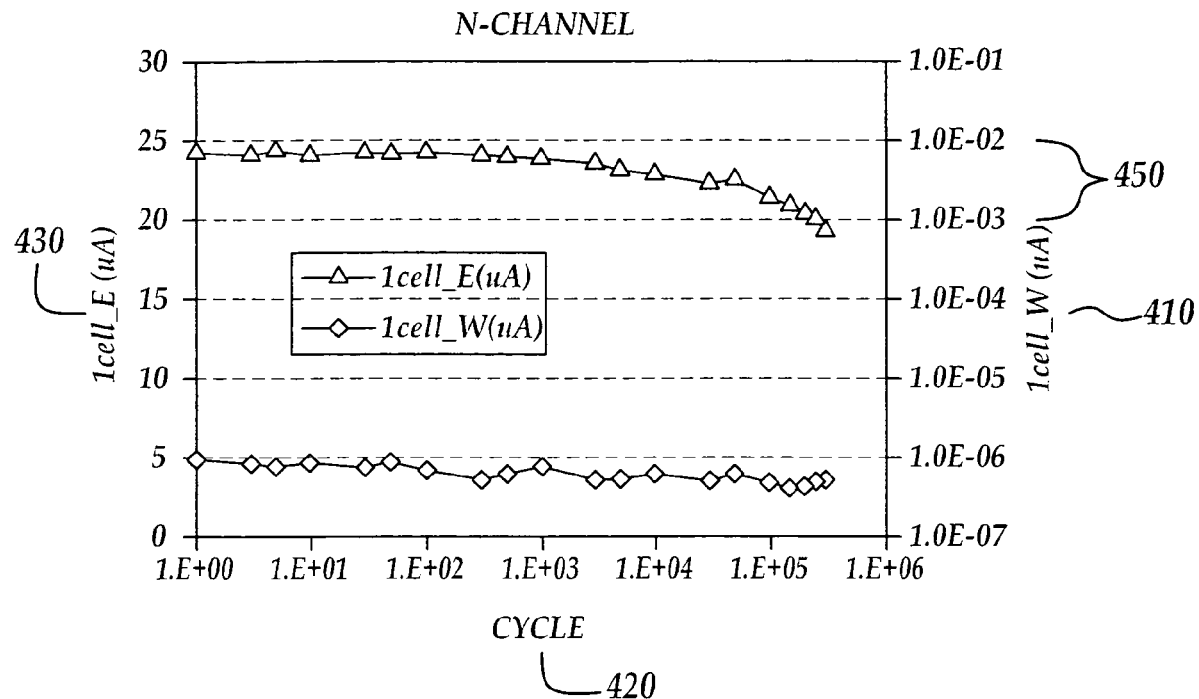
FIG. 4B illustrates, in a graphical form, an endurance performance of a conventional, stack-gate, N-channel flash memory cell.

FIG. 4B illustrates, in a graphical form, an endurance performance of a traditional stack-gate, N-channel cell memory cell. A corresponding graph for the traditional stack-gate, N-channel cell shows a higher value 450 for the factor delta 440 indicating a more rapid degradation in the endurance performance of the traditional cell.

Figure 5:
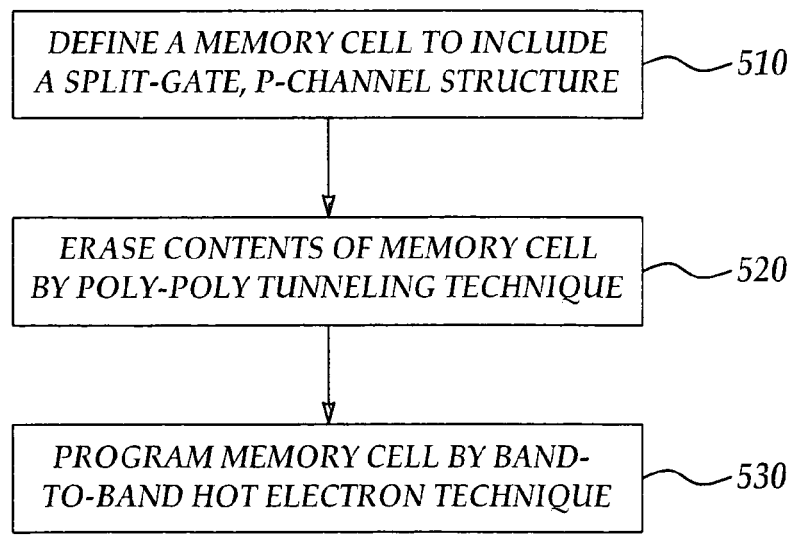
FIG. 5 is a flow chart illustrating a method for improving endurance characteristics of a flash memory cell, according to an embodiment.

FIG. 5 is one embodiment of a flow chart illustrating a method for improving endurance characteristics of a flash memory cell. In step 510, a flash memory cell is defined to include a split-gate, P-channel structure, e.g., structure of the memory cells 100 or 200 described in FIG. 1 and FIG. 2. In step 520, the flash memory cell, having a structure substantially similar to the memory cells 100 or 200, is erased by deploying a polysilicon-polysilicon tunneling technique. In step 530, the flash memory cell, having a structure substantially similar to the memory cells 100 or 200, is programmed by deploying a band-to-band hot electron technique.

Various steps of FIG. 5 may be added, omitted, combined, altered, or performed in different orders. For example, in one embodiment, step 530 may be performed before step 520.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A split-gate flash memory cell comprising:
an N-type well, region formed in a substrate, the N-type well region having formed therein a P+ source, a P+ drain, and a channel region extending between the P+ source and the P+ drain;
a first insulating layer disposed over the well region;
a polysilicon floating gate comprising a lower portion and a top portion to form a polysilicon-polysilicon interface, said floating gate disposed over the first insulating layer, wherein the floating gate is positioned over a first portion of the channel region but not a second portion of the channel region;
a second insulating layer disposed over floating gate;
a control gate including a first portion disposed over the first insulating layer, the first portion of the control gate being positioned over the second portion of the channel region, the control gate including a second portion disposed over the second insulating layer; and
wherein the cell is operable to be programmed by a band-to-band hot electron (BBHE) technique and erased by a polysilicon to polysilicon tunneling technique comprising said interface.

2. The memory cell of claim 1, wherein the second insulating layer has a top wall portion disposed over the floating gate and a sidewall portion immediately adjacent to the floating gate.

3. The memory cell of claim 2, wherein the first portion of the control gate is positioned immediately adjacent to the sidewall portion of the second insulating layer, wherein the second portion of the control gate is disposed over the top wall portion of the second insulating layer to minimize capacitive coupling with the floating gate.

4. The memory cell of claim 1, wherein the channel region is a P-channel.

5. The memory cell of claim 1, wherein the floating gate includes a tip portion, said tip portion formed by a double convex shape of said top portion, the tip portion producing a stronger electric field compared to the memory cell without the tip.

6. The memory cell of claim 1, wherein the cell is operable by applying dual high voltages.

7. The memory cell of claim 1, wherein the cell is operable by applying single high voltages.

8. The memory cell of claim 1, wherein the P+ drain is coupled to a bit line of the cell.

9. The memory cell of claim 1, wherein the control gate is coupled to a word line of the cell.

10. A method for improving endurance characteristics of a flash memory cell, the method comprising:
defining the flash memory cell to include a split-gate, P-channel structure comprising a polysilicon floating gate comprising a polysilicon top portion to form a polysilicon-polysilicon interface;
a control gate both laterally adjacent said floating gate and overlying said floating gate;

erasing the flash memory cell by a polysilicon to polysilicon tunneling technique comprising said polysilicon-polysilicon interface; and programming the flash memory cell by a band-to-band hot electron technique.

11. The method of claim 10, wherein the flash memory cell further comprises:

an N-type well region formed in a substrate, the N-type well region having formed therein a P+ source, a P+ drain, and a channel region extending between the P+ source and the P+ drain;

a first insulating layer disposed over the well region;

said floating gate disposed over the first layer, wherein the floating gate is positioned over a first portion of the channel region but not a second portion of the channel region;

a second insulating layer disposed over the floating gate;

said control gate including a first portion disposed over the first insulating layer, the first portion of the control gate being positioned over the second portion of the channel region, the control gate including a second portion disposed over the second insulating layer.

12. The method of claim 11, wherein the second insulating layer has a top wall portion disposed over the floating gate and a sidewall portion immediately adjacent to the floating gate.

13. The method of claim 11, wherein the first portion of the control gate is positioned immediately adjacent to the sidewall portion of the second insulating layer, wherein the second portion of the control gate is disposed over the top wall portion of the second insulating layer to minimize capacitive coupling with the floating gate.

14. The method of claim 11, wherein the channel region is a P-channel.

15. The method of claim 11, wherein the floating gate includes a tip portion, said tip portion formed by a double convex shape of said top portion, the tip portion producing a stronger electric field compared to the memory cell without the tip.

16. The method of claim 11, wherein the cell is operable by applying dual high voltages.

17. The method of claim 11, wherein the cell is operable by applying single high voltages.

18. The method of claim 11, wherein the P+ drain is coupled to a bit line of the cell.

19. The method of claim 11, wherein the control gate is coupled to a word line of the cell.

20. A split-gate flash memory cell comprising:

an N-type well region formed in a substrate, the N-type well region having formed therein a P+ source, a P+ drain, and a channel region extending between the P+ source and the P+ drain;

a first insulating layer disposed over the well region;

a polysilicon floating gate disposed over the first insulating layer, wherein the floating gate is positioned over a first portion of the channel region but not a second portion of the channel region and wherein said floating gate comprises a polysilicon-polysilicon interface;

a second insulating layer disposed over the floating gate;

a control gate including a first portion disposed over the first insulating layer, the first portion of the control gate being positioned over the second portion of the channel region, the control gate including a second portion disposed over the second insulating layer; and wherein the cell is operable to be programmed by a band-to-band hot electron (BBHE) technique; and wherein the cell is operable to be erased by a polysilicon to polysilicon tunneling technique comprising said polysilicon-polysilicon interface.

* * * * *